US009577622B2

(12) United States Patent
Da Dalt et al.

(10) Patent No.: US 9,577,622 B2
(45) Date of Patent: Feb. 21, 2017

(54) PHASE INTERPOLATOR

(71) Applicant: Infineon Technologies AG, Neubiberg (DE)

(72) Inventors: Nicola Da Dalt, Sattendorf (AT); Roberto Nonis, Villach (AT); Thomas Santa, Seeboden (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/706,874

(22) Filed: May 7, 2015

(65) Prior Publication Data

US 2015/0326203 A1    Nov. 12, 2015

(30) Foreign Application Priority Data

May 7, 2014   (DE) ........................ 10 2014 106336.8

(51) Int. Cl.
*H03H 11/16* (2006.01)
*H03K 5/13* (2014.01)
*H03H 11/20* (2006.01)
*H03K 5/00* (2006.01)

(52) U.S. Cl.
CPC ................ *H03K 5/13* (2013.01); *H03H 11/20* (2013.01); *H03K 2005/00052* (2013.01)

(58) Field of Classification Search
None
See application file for complete search history.

(56) References Cited

U.S. PATENT DOCUMENTS

| 6,539,072 | B1* | 3/2003 | Donnelly | G06F 1/10 327/158 |
| 7,266,169 | B2* | 9/2007 | Zhang | H03K 5/13 331/25 |
| 2004/0145401 | A1* | 7/2004 | Chiba | G06F 1/04 327/291 |
| 2007/0001741 | A1* | 1/2007 | Pikering | H03K 5/13 327/359 |
| 2009/0289672 | A1* | 11/2009 | Hua | H03L 7/07 327/147 |
| 2014/0055179 | A1 | 2/2014 | Gong et al. | |

* cited by examiner

*Primary Examiner* — Cassandra Cox
(74) *Attorney, Agent, or Firm* — Shumaker & Sieffert, P.A.

(57) ABSTRACT

Phase interpolators are provided where an adjustment current is added to currents from a plurality of switchable current sources, for example to reduce an integrated non-linearity.

20 Claims, 4 Drawing Sheets

PHASE INTERPOLATOR

RELATED APPLICATIONS

The present application claims priority benefit of German Patent Application 102014106336.8, which was filed on May 7, 2014. The entire content of the German Patent Application 102014106336.8 is hereby incorporated herein by reference.

TECHNICAL FIELD

The present application relates to phase interpolators and to corresponding methods.

BACKGROUND

Phase interpolators are devices which receive two or more input signals which typically have a same frequency, but different phases. The phase interpolator then generates at least one further signal which typically also has the same frequency and a phase which is between the phases of the at least two input signals. Via a control signal, the phase of the signal output by the phase interpolator may be adjustable. Such phase interpolators conventionally are for example employed in phase-locked loops (PLLs) and/or clock and data recovery circuits (CDR), but may also be used in other applications where a signal with a desired phase is to be generated.

One kind of phase interpolators is for example a current steering phase interpolator, where a current from one or more current sources is selectively routed to input devices receiving input signals having different phases. A phase of an output signal then depends on a distribution of the current to the input devices. These and other phase interpolators may suffer from nonlinearities, for example an integral nonlinearity (INL) which may describe a deviation of the phase of the output signal depending on a control signal, for example a digital control word, from an ideal linear behaviour. Such an integral nonlinearity may for example include an intrinsic integrated nonlinearity of the phase interpolator, for example due to interpolation of signals having a sinusoidal waveform. A weighted addition of such signals may generally exhibit a nonlinear behaviour. The integrated nonlinearity may also comprise nonlinearities caused for example by a mismatch of devices of or components of the phase interpolator (for example mismatch of transistors) or nonlinearities caused by a distortion of input waveforms like the above-mentioned sinusoidal waveforms. However, for some applications, an improved linearity would be desirable.

DETAILED DESCRIPTION

In the following, various embodiments will be described in detail with reference to the attached drawings. It is to be noted that these embodiments are given for illustration purposes only and are not to be construed as limiting the scope of the present application. For example, while embodiments may be described as comprising a plurality of features or elements, in other embodiments some of these features or elements may be omitted, and/or replaced by alternative features or elements. In other embodiments, additional features or elements may be present.

Furthermore, features or elements from different embodiments may be combined with each other unless specifically noted otherwise.

In some embodiments, an adjustment current is provided to summing nodes where selected currents from a plurality of current sources are summed up in a phase interpolator. The adjustment current may be chosen to improve a linearity of the phase interpolator in some embodiments. In some alternative embodiments, adjustment currents may be provided to the current sources. The summed and adjusted currents may in some embodiments then be fed to an input stage, the input stage receiving phase signal inputs.

Further embodiments will now be described referring to the figures. These figures serve illustrative purposes only, and the figures and the associated description are not to be construed as limiting.

Figure 1:
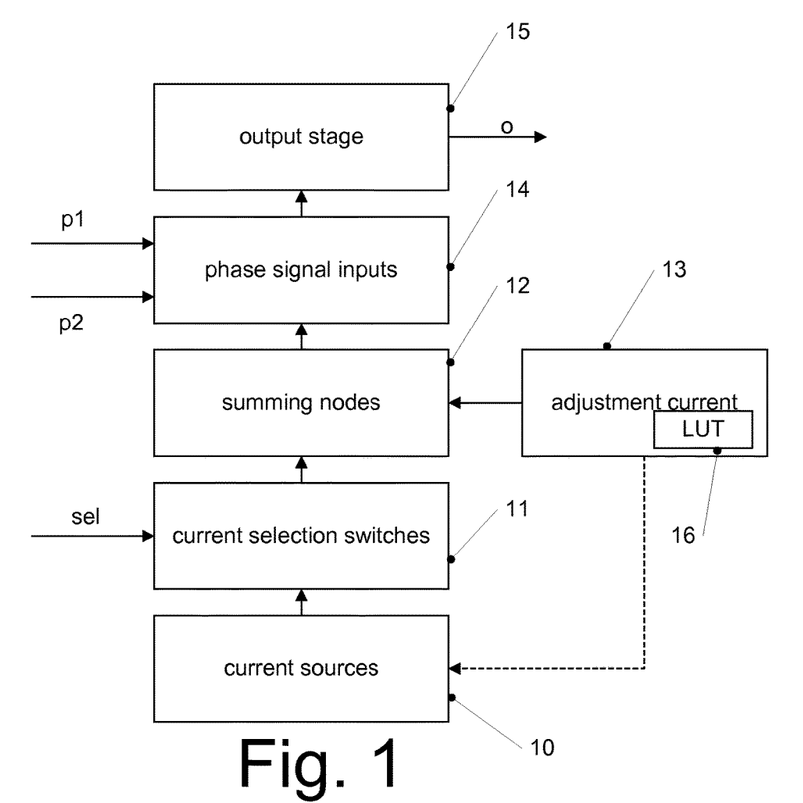
FIG. 1 is a schematic block diagram illustrating a device according to an embodiment.

In FIG. 1, a phase interpolator device according to an embodiment is shown. The phase interpolator device of FIG. 1 receives a plurality of phase input signals, two phase input signals p1 and p2 being shown for illustration purposes in FIG. 1. In other embodiments, more than two, for example four, phase input signals may be provided. The phase input signals p1, p2 may have a same frequency, but a different phase. For example, phase input signals may have a phase offset of 90°, although other phase offsets are also possible. In some embodiments, the phase input signals may be sinusoidal signals, although other wave forms are also possible, for example rectangular or triangular wave forms.

The phase interpolator device of FIG. 1 outputs an output signal o which in embodiments has the same frequency as phase input signals p1, p2, and has a phase between the phases of phase input signal p1, p2. In some embodiments, the phase output signal o is adjustable using a selection signal sel. In some embodiments, selection signal sel may be a digital control word.

To perform the phase interpolation, the embodiment of FIG. 1 comprises a plurality of current sources 10. Current sources 10 may each provide a same current, or may provide different currents, for example binary weighted currents. Controlled by selection signal sel, a corresponding plurality of current selection switches 11 selects current sources, the current of which is to be summed at least two summing nodes 12. Currents from the at least two summing nodes 12 are modified, for example modulated, in a phase signal input stage 14 based on input signals p1, p2. This may correspond to a weighting of signals p1, p2, based on the currents. As the magnitude of the currents at the summing nodes 12 is adjustable by current selection switches 11, this in embodiments amounts to an adjustment of weights of p1 and p2. The weighted signals are combined in an output stage 15 to form output signal o. For example, depending on the weighting, the phase of output signal o may be closer to the phase of p1 or closer to the phase of p2. Thus, in embodiments, an output signal o with a selectable phase is provided.

In some embodiments, a phase of output signal o may exhibit nonlinearities with respect to the selection signal sel (for example a digital control word). For example, it may be desirable that with each increase of such a digital control word by one least significant bit (LSB) the phase changes by the same amount or, in other words, that the spacing of selectable phases is equidistant. However, due to various effects, nonlinearities may occur which lead to deviations from such an equidistant spacing. Such a nonlinearity may occur at all phases and/or may be dependent on the value of the selection signal sel. As mentioned in the background section, such nonlinearities may be due to intrinsic effects, for example occurring when adding sinusoidal signals p1 or p2 (or also non-sinusoidal signals), or due to extrinsic effects like device mismatch (for example mismatch between transistors used for implementing current selection switches, summing nodes 12, phase signal inputs 14 etc.) or also caused by distortions of the input signals, for example deviations from a sinusoidal shape.

To mitigate such a nonlinearity, in some embodiments an adjustment current is provided to summing node(s) 12 by a current adjustment circuit 13, at least partially compensating the above-mentioned nonlinearities, for example an integral nonlinearity (INL). In alternative embodiments, as indicated by a dashed arrow in FIG. 1, an adjustment current may be provided to current sources 10. This alternative indirectly provides the adjustment current to summing node(s) 12 via selection switches 11. However, in some embodiments providing the adjustment current directly to summing node(s) 12 may be easier to implement in terms of an area needed, as in some embodiments less summing nodes may be provided than current sources 10, and therefore adjustment may be easier and/or less adjustment currents may need to be provided. Non-limiting implementation examples of some of the elements shown in FIG. 1 will be discussed later with reference to FIG. 3.

Figure 2:
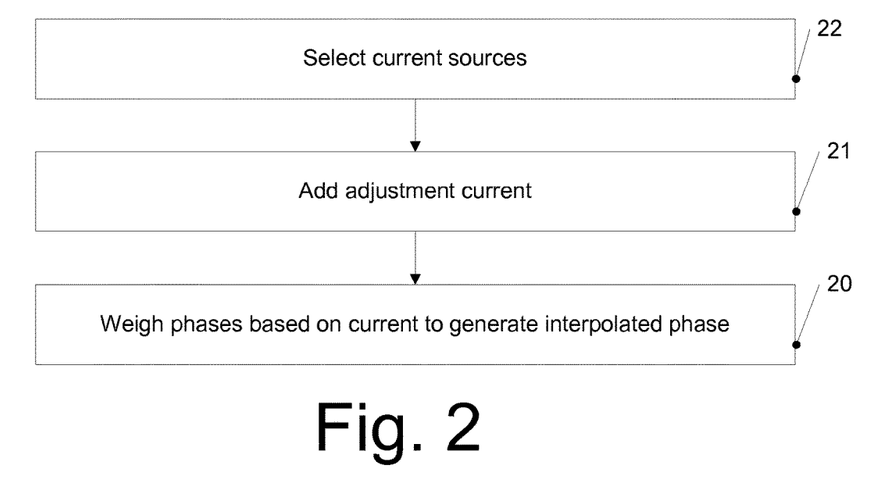
FIG. 2 is a flow chart illustrating a method according to an embodiment.

In FIG. 2, a flow chart illustrating a method according to an embodiment is shown. While the flow chart of FIG. 2 illustrates a method as a series of acts or events, it is to be noted that the order in which those acts or events are depicted and/or described is not to be construed as limiting. Acts or events shown and described may be performed in a different order, or acts or events may be performed concurrently with each other (for example by separate parts of a circuit), and/or may be performed repetitively.

The method illustrated in FIG. 2 may for example be used for operating a phase interpolator, for example the phase interpolator of FIG. 1 described above or the phase interpolator of FIG. 3 to be described further below. However, the method of FIG. 2 may also be applied to other phase interpolators or similar devices.

At 22, the method of FIG. 2 comprises selecting one or more current sources of a plurality of current sources to supply current to one or more summing nodes. At 21, an adjustment current is added. In some embodiments, adding the adjustment current comprises adding the adjustment current at the summing nodes. In other embodiments, the method may comprise adding the adjustment current at the current sources. At 20, phases, i.e. phase input signals having different phases, are weighed based on currents at the summing node to generate a signal having an interpolated phase. In other embodiments, other techniques may be implemented.

In some embodiments, by adding the adjustment current at 21, a linearity of the phase interpolation may be improved. For example, an integrated nonlinearity (INL) may be reduced.

Figure 3:
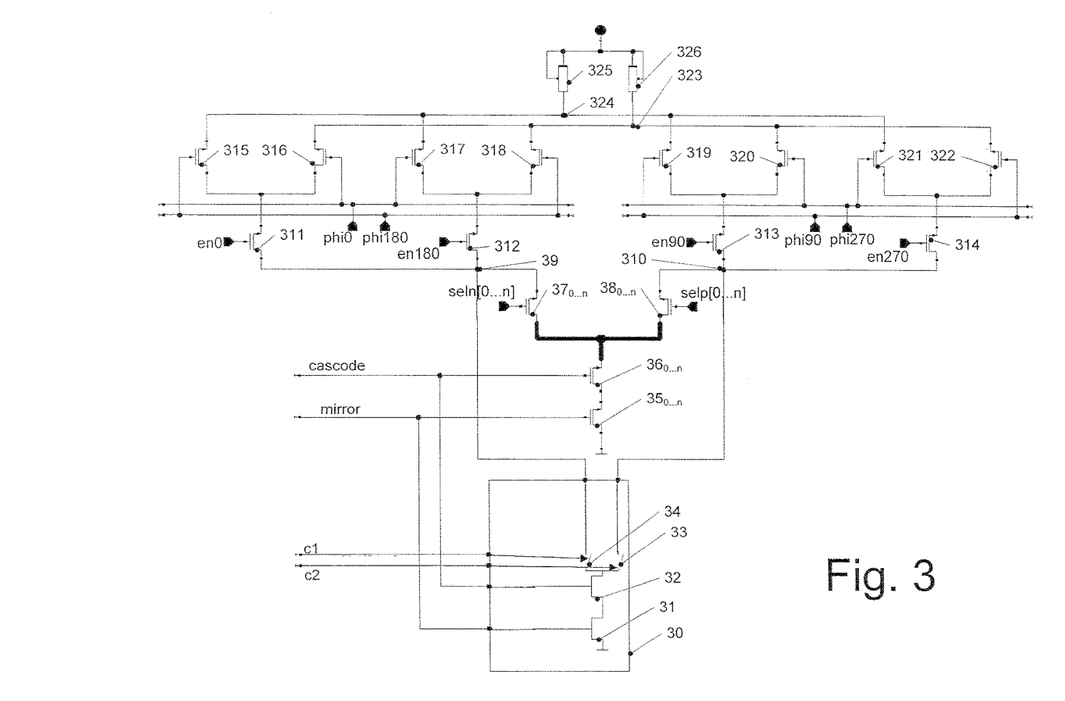
FIG. 3 is a circuit diagram illustrating a device according to an embodiment.

In FIG. 3, a circuit diagram of a phase interpolator device according to an embodiment is shown. While FIG. 3 shows numerous details, this serves illustrative purposes only, and in other embodiments some of these details may also be omitted, and other implementations may be used.

The embodiment of FIG. 3 comprises an adjustment block 30 which, as will be explained in the following in more detail, provides an adjustment current which may at least partially compensate an integrated nonlinearity (INL) of the phase interpolator device. Before describing current adjustment block or circuit 30, the functioning of the remaining phase interpolator device will be explained in detail. It should be noted that a current adjustment block 30 may also be provided to other types of phase interpolator devices, for example conventional phase interpolator devices, to reduce a nonlinearity thereof.

The phase interpolator device of FIG. 3 comprises a plurality of matched current sources $35_{0\ldots n}$ which may for example be implemented as current mirrors (as indicated by "mirror" in FIG. 3), of which one NMOS transistor is shown. Current sources $35_{0\ldots n}$ are coupled in a cascode configuration with cascode transistors $36_{0\ldots n}$, as indicated by "cascode" in FIG. 3. Cascode transistors $36_{0\ldots n}$ may in some embodiments provide a more stable operation of current sources $35_{0\ldots n}$ compared to a configuration without cascode transistors. Other implementations of current sources may also be used. In an example implementation, n may be 63, such that 64 current sources are provided. In other implementations, a different number of current sources may be provided. For simplicity of representation, only one current source 35 represented by an NMOS transistor coupled with a cascode transistor 36 are shown. In some embodiments, all current sources nominally provide a same current (nominally meaning apart from manufacturing tolerances etc.). In other embodiments, other configurations of current sources may be used, e.g., weighted current sources. Each current source 35 is coupled with a pair of switches $37_{0\ldots n}$, $38_{0\ldots n}$. Switches 37, 38 may also be implemented using NMOS transistors as shown. Each pair of switches 37, 38 is associated with, e.g. coupled in series with the series connection of one of the current sources 35 with one of the cascode transistors 36, as shown. Again, for simplicity's sake, only a single pair of switches 37, 38 is shown in FIG. 3. Switches $37_{0\ldots n}$ are controlled by a control signal seln, which may be a digital control word having n+1 bits (bits 0 to n), each bit controlling one of the switches $37_{0\ldots n}$. Likewise, switches $38_{0\ldots n}$ are controlled by a control signal selp, which may be a digital control word having n+1 bits (bits 0 to n), each bit controlling one of switches 38. Using selection signals seln, selp, current from current sources 35 may be selectively coupled to either a node 39 (by activating a respective switch 37) or a node 310 (by activating a respective switch 38). By providing a plurality of current sources like current sources $35_{0\ldots n}$, each providing a defined current, and providing the plurality of switches $37_{0\ldots n}$, $38_{0\ldots n}$ defined currents may selectively be provided to node 39 and node 310. In other embodiments, other configurations may be used where switches serve to provide currents in a defined manner to nodes 39, 310 in an adjustable or selectable manner.

The summed current at node 39 is either provided to a differential pair of NMOS transistors 315, 316 via a switch 311 enabled by a signal en0 or to a differential pair of NMOS transistors 317, 318 via a switch 312 enabled by a signal en180. A summed current at node 310 is either provided to a differential pair of NMOS transistors 319, 320 via a switch 313 enabled by a signal en90, or to a differential pair of NMOS transistors 321, 322 via a switch 314 enabled by a signal en270, as shown. The differential pairs 315-322 are an example implementation of a phase signal input stage like stage 15 of FIG. 1. Switches 311 to 314 may be implemented as NMOS transistors. Gate terminals of NMOS transistors 316 and 317 are coupled with a signal phi0, gate terminals of NMOS transistors 315 and 318 are coupled with a signal phi180, gate terminals of NMOS transistors 319 and 322 are coupled with a signal phi90 and gate terminals of NMOS transistors 320 and 321 are coupled with a signal phi270. Phi0, phi90, phi180 and phi270 are input signals having a same frequency, but different phases. In the example embodiment of FIG. 3, the signals have successive phase offsets of 90°, as indicated by the numbers of the signal names (i.e. phi0 has a relative phase offset of 0°, phi90 a relative phase offset of 90°, phi180 a relative phase offset of 180° (which may mean that phi180 is an inverted version of phi0), and phi270 a relative phase offset of 270° (which may mean that phi270 is an inverted version of phi90)). Phi0 to phi270 may be common mode logic (CML) signals.

Using the signals en0 to en270, a "quadrant" for interpolation may be selected. For example, to generate an output signal with a phase offset between 0 and 90°, en0 and en90 would activate the respective switches 311, 313, while en180 and en270 would deactivate switches 312, 314. Output currents of the differential pairs 315-322 selected by signals en0 to en270 correspond to currents at summing nodes 39 or 310 modified by respective signals phi0-phi180. The output currents of the differential pairs of NMOS transistors 315 to 322 are summed at nodes 323, 324. For example, when en0 and en90 are selected, a first modified current corresponding to the a part of the current from node 39 as modified by phi0 at transistor 316 and a second modified current corresponding to a part of the current from node 310 as modified by phi270 at transistor 320 are summed at node 323, a third modified current corresponding to another part of the current from node 39 as modified by phi180 at transistor 315 and a fourth modified current corresponding to another part the current from node 310 as modified by phi90 at transistor 319 are summed at node 324. In other words, differential pair 315, 316 splits the current from node 39 into the first modified current to node 323 and the third modified current to node 324, and differential pair 319, 320 splits the current from node 310 into the second modified current to node 323 and the fourth modified current to node 324. The output currents through nodes 323, 324 then generate a voltage drop over resistors 325, 326, which are coupled between nodes 324 and 323, respectively, and a positive supply voltage, for example VDD or another positive supply voltage. Resistors 324, 326 are an example for an output stage. The output signals are the resulting voltages at nodes 324 and 323, the voltage at node 323 e.g. being inverted with respect to the voltage at node 324. The voltages at nodes 324 and 323 may then be output to any further processing device for which the output signal is intended, for example a device arranged downstream of the phase interpolator in a phase-locked loop including the phase interpolator. The voltages at nodes 324 and 323 correspond to a differential signal having a phase which is phase-shifted with respect to phi0 corresponding to the selection signals seln, selp and signals en0 to en270. By using differential pairs in the embodiment of FIG. 3, a differential output signal may be provided at nodes 323, 324. In other embodiments, single-ended output signals may be provided by using only a single output node.

Just to give an example, to generate an output signal with a phase offset of 45°, i.e. a phase in the middle between the phases of input signals phi0 and phi90, in the embodiment of FIG. 3 for example half of the switches 37 and half of the switches 38 may be activated (for example, in case 64 switches and current sources are provided, switches $38_0$ to switches $38_{31}$ and switches $37_{32}$ to $37_{63}$ could be activated such that a current generated by current sources $35_0$ to $35_{31}$ flows to summing node 39 and the current generated by current sources $35_{32}$ to $35_{63}$ flows to summing node 310), such that the same amount of current is supplied to nodes 39 and 310. Furthermore, switches 311 and 313 in this case would be activated by signals en0 and en90, and switches 312, 314 would be deactivated by en180 and en270. The output signal then could be tapped at node 324 or at both nodes 324, 323 as a differential signal. For generating a greater phase offset, e.g. about 50°, some more of current sources $35_{0 \ldots n}$ may be coupled with summing node 310 instead of summing node 39, corresponding to e.g. giving a greater weight to phi90 (and phi270) than to phi0 (and phi180), which shifts the resulting phase more towards 90°.

However, the structure presented so far in embodiments may exhibit an integral nonlinearity of its output phase with respect to the selection signals seln, selp.

As already mentioned initially, to mitigate or reduce this nonlinearity, a current adjustment block 30 is provided. Current adjustment block 30 comprises one or more further current sources 31, which may be implemented as a current mirror, coupled with a cascode transistor 32. In other words, the one or more further current sources 31 may be implemented similar to current sources 35, although parameters like transistor width etc. may also vary, e.g. to provide different currents. While a single further current source 31 is depicted in FIG. 3, a plurality of further current sources may be provided. For example, binary weighted further current sources may be provided to provide an adjustable current, which in an embodiment may for example be between 0 and a current provided by a current source 35, although other values, for example other values matching current supplied by current sources 35, may also be possible. In some embodiments, at least one of the one or more further current sources 31 may be configured to provide a smaller current than each of current sources 35, for example to provide the possibility for small adjustments as explained below. In other embodiments, additionally or alternatively at least one of the one or more further current sources 31 may be adapted to generate a larger current than each of current sources 35, for example to provide the possibilities of large adjustments.

Via switches 33, 34 controlled by control signals c1 and c2, current from further current sources 31 may selectively be added to the currents fed to node 39 or node 310 by current sources $35_{0 \ldots n}$. C1 and c2 may be digital words, for example four bit words, to control a plurality of switches corresponding to a plurality of further current sources 31. In this way, an adjustable current may be provided to either node 39 or node 310. In some embodiments, this added current allows moving a crossing of the output signals at nodes 323, 324 (i.e. a zero-crossing of the difference between the output signals at nodes 323, 324) in a desired direction, corresponding to an adjustment of the phase position, to reduce nonlinearities.

In other embodiments, adjustment currents may be provided to current sources $35_{0 \ldots n}$ directly, for example at a node between transistors 35, 36 or at a node between cascode transistors 36 and switch transistors 37, 38.

In an embodiment, signals c1, c2 may depend on signals seln, selp, i.e. on a switching state of switches $37_{0 \ldots n}$ and $38_{0 \ldots n}$. For example, for each value of signals seln, selp corresponding values of signals c1, c2 may be stored in a look-up table and applied to switches 33, 34 to supply an appropriate adjustment current to nodes 39, 310. Suitable values for signals c1, c2 for each value of seln, selp may for example be obtained via a calibration. Such a calibration may be performed at manufacture or may be performed repeatedly during the lifetime of the phase interpolator, for example in regular or irregular intervals. In other embodiments, c1 and c2 may have fixed values such that fixed adjustment currents are applied to nodes 39, 310.

Using a phase interpolator as illustrated above for example in a phase-locked loop may reduce jitter of the phase-locked loop.

Figure 4:
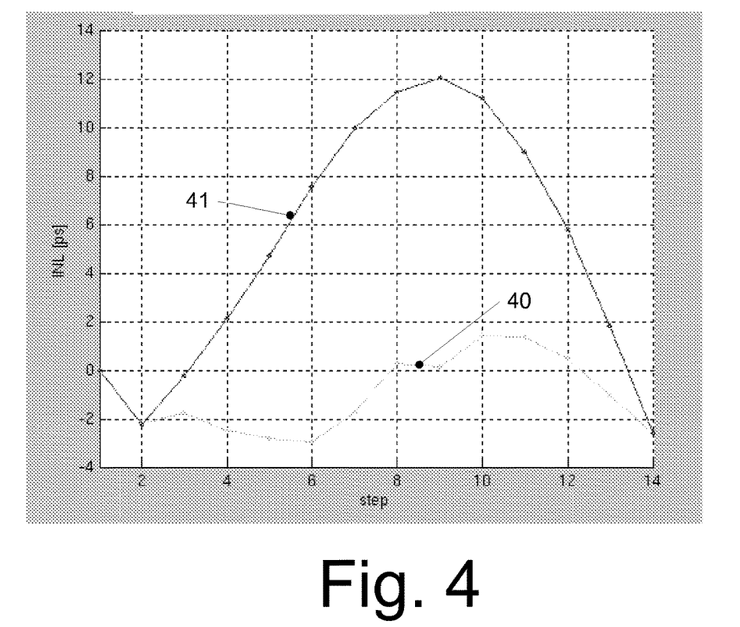
FIG. 4 is a diagram illustrating a behaviour of a device according to an embodiment compared to a conventional device.

To give an example of the effect of the adjustment currents to reduce nonlinearity, FIG. 4 illustrates an integrated nonlinearity (INL) in picoseconds (ps) for a phase interpolator similar to the one shown in FIG. 3 versus a value of a control word (like seln or selp). The integrated nonlinearity here is a deviation of the output phase in picoseconds from an ideal case with an equidistant step size between values of the control word.

A curve 41 shows the integrated nonlinearity for a phase interpolator without current adjustment (for example, the phase interpolator of FIG. 3 without block 30), while a curve 40 shows the integrated nonlinearity for a phase interpolator with current adjustment. As can be seen, by using the current adjustment, the integrated nonlinearity may be significantly reduced. It should be noted that the curves shown in FIG. 4 illustrate purposes and relate to a particular implementation of an embodiment. In other embodiments or other implementation, other curves, i.e. other values of integral nonlinearity, may apply.

Next, techniques for calibrating phase interpolator devices, for example devices as discussed above, for example to determine a relationship between an adjustment current supplied and a control signal like control signal sel of FIG. 1 or control signals seln, selp of FIG. 3, will be discussed. The results of such a calibration, as already mentioned, may be stored in a memory, for example as a look-up table stored in a memory like memory 16 of FIG. 1.

Generally, in some embodiments, a deviation of a phase position of an output signal from an ideal position may be measured depending on a control signal, and an adjustment current may be determined depending on the measured deviation to reduce or minimize the deviation.

Figure 5:
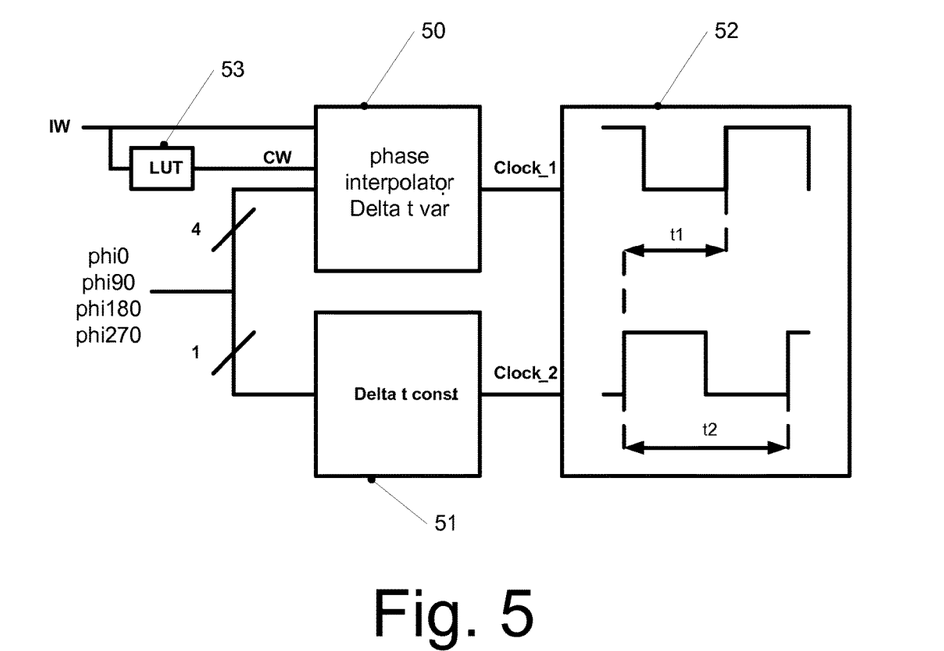
FIG. 5 is a schematic block diagram illustrating a device according to an embodiment.

In FIG. 5, a device to perform such a calibration according to an embodiment is schematically shown. Other devices may also be used. The device of FIG. 5 comprises a phase interpolator 50, which may for example be implemented as discussed with reference to FIG. 1 or as discussed with reference to FIG. 3. In the example device of FIG. 5, phase interpolator 50 receives for phase input signals phi0 to phi270, similar to the phase interpolator device discussed with reference to FIG. 5. Phase interpolator device 50 then combines two of the four phases (for example depending on signals like en0 to en270 of FIG. 3) and weighs then according to an interpolation word IW. Interpolation word IW may, for example, correspond to digital words seln, selp of the embodiment of FIG. 3. However, other implementations of the phase interpolator 50 than the ones shown in FIGS. 1 and 3 are also possible, as long as a phase position of an output signal is controllable via a control signal like an interpolation word, and nonlinearities may be adjusted using an additional correction control signal.

Phase interpolator 50, depending on interpolation word IW, outputs a first clock signal Clock_1 having a variable phase position, for example a variable time position $\Delta t$ of a zero-crossing (or crossing between differential signals) with respect for example to signal phi0. In some embodiments, signals phi0 to phi270 may be current mode logic (CML) signals, and signal Clock_1 may be a CMOS logic based signal, although other kinds of signals may also be used.

Furthermore, one of the signals phi0 to phi270, for example phi0, may be fed to a block 51 which outputs a signal corresponding to phi0 as a signal Clock_2. Therefore, Clock_2 has a fixed relationship, corresponding to a constant time difference $\Delta t$, to signal phi0. This constant relationship may for example be determined by delays in block 51, which in embodiments where phi0 is a current mode logic signal may convert this current mode logic signal to a CMOS logic signal.

A block 52 converts a time difference between Clock_1 and Clock_2 to a digital value. This digital value in some embodiments may have a high resolution, for example more than 10 bits, like 20 bits or more. In some embodiments, for implementing block 52, a conventional time-to-digital converter (TDC) with a suitable resolution may be used. Inside block 52, example signals for clock 1 and clock 2 are shown in FIG. 5. A period of the clock signal is labeled t2 in FIG. 5, and a time difference between clock 1 and clock 2 is labeled t1 in FIG. 5. In some embodiments, the time difference may be given or calculated as a ratio of t1 to t2 for a specific control word IW, i.e. $\alpha_{IW}=t1/t2$, wherein $\alpha_{IW}$ is a measure for the above-mentioned time difference.

Throughout the calibration which will be described below, in embodiments where the device of FIG. 5 is used, t2 (corresponding to a period of phi0) may be kept constant. Furthermore, an ideal size of a phase step corresponding to one least significant bit of the interpolation word is known. For example, if the interpolation word has 64 bits to control 64 current sources, as given as an example for the phase interpolator of FIG. 3, and the interpolation word controls the phase within a quadrant (for example from 0° to 90° (corresponding for example to en0 and en90 enabled in FIG. 3)), an ideal step size $\alpha_{IDEAL}$ would Correspond to 1/63. With a full period corresponding to 360°, this would lead to an ideal step size $\alpha_{IW+1\ LSB}-\alpha_{IW}$ of 1/63, LSB signifying least significant bit, i.e. the smallest step enabled by the interpolation word IW. In embodiments, therefore, $\alpha_{IW+1\ LSB}-\alpha_{IW}$ represents a measure for the phase difference caused by increasing the interpolation word by one least significant bit, and $\alpha_{IDEAL}$ represents an ideal or target value for this measure.

With the device shown in FIG. 5, the interpolation word IW may for example be varied in a step-wise manner, and for each step the change in phase difference may be calculated based on two adjacent measurements (for example $\alpha_{IW+1\ LSB}-\alpha_{IW}$ as measured by block 52). This measured step size may be compared to the ideal step size as mentioned above. Deviations between ideal step size and measured step size may be reduced or mitigated by adjusting a correction word CW, which may for example correspond to signals c1, c2 of the embodiment of FIG. 3. In some embodiments, correction word CW may be varied until a minimum of the above-mentioned deviation between measured value and therefore, an optimized value of the correction word CW for the respective interpolation word IW is found. Such optimized values may then be stored in a look-up table 53 of FIG. 5, for example in a memory like memory 16 of FIG. 1, such that in operation a correction word CW may be selected depending on the interpolation word IW.

In some embodiments, for each interpolation word a corresponding correction word CW may be stored in look-up table 53. In other embodiments, correction words may be stored for groups of interpolation words, for example adjacent interpolation words, in case in a system the necessary correction changes only slowly with the interpolation word. For example, correction words may be stored for groups of four interpolation words corresponding to four steps of one least significant bit.

Therefore, with the device of FIG. 5 in some embodiments a calibration to obtain appropriate correction words CW for various input words IW may be obtained. In some embodiments, the device of FIG. 5 may be implemented on a single chip, thus enabling an on-chip calibration, which may in some embodiments be performed repeatedly, for example in predetermined intervals, to update the calibration.

Figure 6:
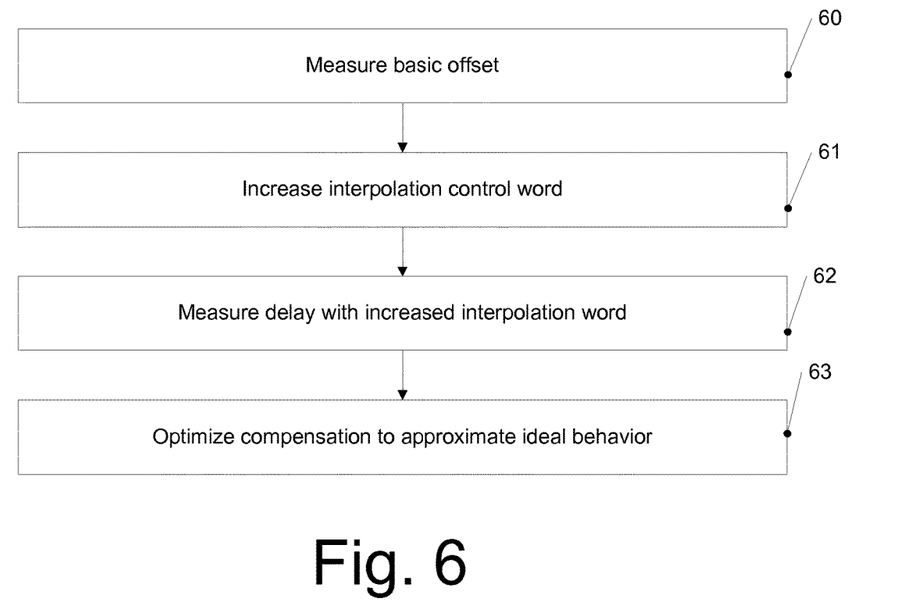
FIG. 6 is a flow chart illustrating a method according to an embodiment.

In FIG. 6, a flow chart illustrating a calibration method is illustrated. The method of FIG. 6 may be implemented using the device illustrated and explained with reference to FIG. 5, but is not limited thereto. Moreover, while the method of FIG. 6 is illustrated as a series of acts or events, the order in which such acts or events are illustrated is not to be construed as limiting. For example, in other embodiments, the order may differ, and/or acts or events illustrated may be performed concurrently with each other.

At 60, the method of FIG. 6 comprises measuring a basic offset between a reference clock signal and a variable clock signal. The phase position of the variable clock signal is variable by a phase interpolator to be calibrated. In the example of the device of FIG. 5, this in an embodiment may correspond to measuring a delay between Clock_1 and Clock_2 with a value of the interpolation word IW of zero. A resulting value $\alpha_0$ then corresponds to the basic or "natural" offset between the two clock signals.

At 61 in FIG. 6, the interpolation control word IW is then increased by one least significant bit, and at 62 the delay between the two clocks with the increased interpolation word is measured. Then, the difference $\alpha_{IW+1\_LSB} - \alpha_{IW}$ may be calculated in some embodiments. At 63, the compensation is then optimised, for example by varying compensation word CW of FIG. 5 accordingly, to approximate an ideal value $\alpha_{IDEAL}$. $\alpha_{IDEAL}$ may be equal $1/IW_{MAX}$, $IW_{MAX}$ being the maximum value of the interpolation word. A compensation word CW which gives a minimum error, i.e. minimum deviation of the difference to $\alpha_{IDEAL}$ may be stored in a look-up table.

The actions described with reference to 61 to 63 may then be repeated to obtain a calibration, i.e. optimised compensation or correction, for all interpolation words. With an embodiment like the method of FIG. 6, correction values may be calibrated such that nonlinearities are reduced. It should be noted that the method and device illustrated with respect to FIGS. 5 and 6 is not only applicable to the phase interpolator devices discussed with reference to FIGS. 1 to 4, but may also be applied to other phase interpolator devices where a phase is controllable by a first signal like a digital control word and additionally a correction signal may be applied.

It is to be emphasized again that the above-described embodiments serve only as examples, and are not to be construed as limiting.

The invention claimed is:

1. A phase interpolator device, comprising:
   a plurality of current sources,
   a plurality of current selection switches associated with the plurality of current sources to selectively couple the current sources to at least two summing nodes,
   a phase signal input stage to receive at least two input signals having different phases, the phase input stage to modify a first current from a first summing node of the at least two summing nodes based on a first input signal of the at least two input signals to generate a first modified current and to modify a second current from a second summing node of the at least two summing nodes based on a second input signal of the at least two input signals to generate a second modified current,
   an output stage to generate an output signal based on the first modified current and the second modified current, and
   a current adjustment circuit to adjust a current through at least one of the first summing node or the second summing node.

2. The device of claim 1, wherein an output of the current adjustment circuit is coupled with an output of the plurality of current selection switches at the at least one summing node.

3. The device of claim 1, wherein the current adjustment circuit is to adjust a current output by the plurality of current sources.

4. The device of claim 1, wherein the current sources of the plurality of current sources are to generate nominally equal currents.

5. The device of claim 1, wherein the adjustment circuit is to adjust a current at the at least one summing node based on a switching state of the plurality of current selection switches.

6. The device of claim 5, further comprising a memory for storing a look-up table, the look-up table storing information describing a dependency between the current adjustment by the current adjustment circuit and the switching state.

7. The device of claim 1, wherein the plurality of current selection switches is controllable by a digital control word.

8. The device of claim 1, wherein the adjustment circuitry comprises a plurality of further current sources, the plurality of further current sources being selectively coupled to the at least one summing node.

9. The device of claim 8, wherein at least one of the plurality of further current sources is to produce a smaller current than each of the plurality of current sources.

10. The device of claim 8, wherein the plurality of further current sources are matched with the plurality of current sources.

11. The device of claim 8, wherein the plurality of further current sources are controllable by a digital control word.

12. The device of claim 8, wherein the plurality of further current sources are to generate different currents.

13. The device of claim 1, wherein the input stage comprises a plurality of transistor pairs.

14. The device of claim 13, further comprising a plurality of switches to selectively enable a part of the differential pairs.

15. The device of claim 1, wherein the current adjustment circuitry is to generate the adjustment current to reduce an integrated nonlinearity of a phase interpolation.

16. A method comprising:
   calibrating a phase interpolator device by:
      determining a first phase that is output by the phase interpolator device, wherein the first phase is associated with a control signal defined by a first value;
      increasing the control signal to a second value;
      determining a phase that is output by the phase interpolator device, wherein the second phase is associated with the control signal defined by the second value;
      determining a phase change between the first phase and the second phase that is caused by the increasing of the control signal;

outputting, to the phase interpolation device, the control signal defined by the second value and a candidate correction signal defined by a third value;

determining a third phase that is output by the phase interpolator device, wherein the third phase is associated with the control signal defined by the second value and the candidate correction signal defined by the third value;

outputting, to the phase interpolation device, the control signal defined by the second value and a candidate correction signal defined by a fourth value;

determining a fourth phase that is output by the phase interpolator device, wherein the fourth phase is associated with the control signal defined by the second value and the candidate correction signal defined by the fourth value; and determining, from the candidate correction signal defined by the third value and the candidate correction signal defined by the fourth value, a correction signal associated with the control signal defined by the second value, wherein the correction signal is used to reduce a difference between the phase change and a target value of the phase change.

17. The method of claim 16, wherein the correction signal is a first correction signal and the phase change is a first phase change, the method further comprising:

increasing the control signal from the second value to a fifth value;

determining a fifth phase that is output by the phase interpolator device, wherein the fifth phase is associated with the control signal defined by the fifth value;

determining a second phase change between the second phase and the fifth phase;

outputting, to the phase interpolation device, the control signal defined by the fifth value and a candidate correction signal defined by a sixth value;

determining a sixth phase that is output by the phase interpolator device, wherein the sixth phase is associated with the control signal defined by the fifth value and the candidate correction signal defined by the sixth value;

outputting, to the phase interpolation device, the control signal defined by the fifth value and a candidate correction signal defined by a seventh value;

determining a seventh phase that is output by the phase interpolator device, wherein the seventh phase is associated with the control signal defined by the fifth value and the candidate correction signal defined by the seventh value; and determining, from the candidate correction signal defined by the sixth value and the candidate correction signal defined by the seventh value, a second correction signal associated with the control signal defined by the fifth value.

18. The method of claim 16, further comprising storing the control signal together with the determined correction signal associated with the control signal.

19. The method of claim 16, wherein the control signal is a digital word, and increasing the control signal comprises increasing the digital word by one least significant bit.

20. The method of claim 16, wherein determining the correction signal comprises:

selecting, as the correction signal, from the candidate correction signal defined by the third value and the candidate correction signal defined by the fourth value, a candidate correction signal that minimizes the difference between the phase change and the target value of the phase change.

* * * * *